(12) United States Patent
Hoang et al.

(10) Patent No.: US 6,169,702 B1
(45) Date of Patent: Jan. 2, 2001

(54) MEMORY DEVICE HAVING A CHIP SELECT SPEEDUP FEATURE AND ASSOCIATED METHODS

(75) Inventors: Tri Minh Hoang, Clifton; Livia Zien, Manassas; Scott Doyle, Centreville; David Lawson, Harwood, all of VA (US)

(73) Assignee: Lockheed Martin Corporation, Bethesda, MD (US)

( * ) Notice: Under 35 U.S.C. 154(b), the term of this patent shall be extended for 0 days.

(21) Appl. No.: 09/320,207

(22) Filed: May 26, 1999

(51) Int. Cl.$^7$ ........................................................ G11C 8/00
(52) U.S. Cl. .................. 365/230.06; 365/194; 365/233.5
(58) Field of Search ............................. 365/230.06, 194, 365/233.5

(56) References Cited

U.S. PATENT DOCUMENTS

| | | | |
|---|---|---|---|
| 5,146,111 | * 9/1992 | Ciraula et al. | 365/189.05 X |
| 5,301,165 | * 4/1994 | Ciraula et al. | 365/233.5 |
| 5,424,985 | * 6/1995 | McClure et al. | 365/194 |
| 5,943,288 | 8/1999 | Jiang | 365/230.06 |
| 5,995,441 | * 11/1999 | Kato et al. | 365/294 X |

\* cited by examiner

Primary Examiner—Huan Hoang
(74) Attorney, Agent, or Firm—Allen, Dyer, Doppelt, Milbrath & Gilchrist, P.A.

(57) ABSTRACT

A memory device includes a plurality of address on-chip receivers (OCRs), an address decoder coupled to the address OCRs, a plurality of first delay circuits coupled between the address OCRs and the address decoder, and a plurality of chip select bypass circuits. Each chip select bypass circuit is respectively coupled to one of the plurality of first delay circuits for initially reducing a delay therein responsive to a control signal. The chip select bypass circuit includes a second delay circuit having a delay less than the first delay circuit, and a disable circuit. The disable circuit disables the first delay circuit and selectively couples the second delay circuit in place of the first delay circuit responsive to the control signal.

48 Claims, 4 Drawing Sheets

MEMORY DEVICE HAVING A CHIP SELECT SPEEDUP FEATURE AND ASSOCIATED METHODS

This invention was made with Government support under Contract Number DSWA-01-96-C-0106 awarded by the Department of the Air Force. The Government has certain rights in this invention.

FIELD OF THE INVENTION

The present invention relates to the field of integrated circuits, and, more particularly, to a memory device.

BACKGROUND OF THE INVENTION

In asynchronous static random access memory (SRAM) devices, no external clock signals are provided. This requires an internally generated clock signal to provide the timing signals for the memory device to operate. The clock signals are produced when an input to the memory device, i.e., an address signal, transitions. This implies that some externally connected device, such as a microprocessor, commands the memory device to perform either a read or a write operation based on new input information.

However, an SRAM device has another input known as a chip select, which places the memory device either in an active select mode or in an inactive deselect mode. The chip select function has long been used in memory devices to disable a memory device to reduce power consumption. Consequently, address on-chip receivers (OCRs) are not responsive to external address signals when the memory device is in the deselect mode.

When an address input signal has been provided to an address input, the deselected address OCR can not respond until it receives the chip select pulse. The chip select pulse is first applied to a chip select input, which is received by the chip select OCR. The chip select OCR then relays the chip select pulse to the address OCR. Unfortunately, the time required for the chip select OCR to relay the chip select pulse to the address OCR introduces an additional time delay when the SRAM comes out of the deselect mode into the select mode.

An external controller, such as a microprocessor, provides the address signal and the chip select pulse to the memory device placing the memory device in the select mode. Referring to FIG. 1, a chip select pulse applied to the chip select input or pad 20 of an SRAM 18 is received by the chip select OCR 22. The chip select OCR 22 then relays the chip select pulse to the address OCR 24. As explained above, the additional time delay from the chip select OCR 22 to the time the address OCR 24 is enabled is added to the chip select access time.

During this additional time delay, an address signal has already been provided to the address input or pad 26 the same time the chip select pulse was applied to the chip select input. When the memory device 18 is in the select mode, there is no delay because the chip select pulse has already enabled the address OCR 24 so that it immediately responds to an address input signal. In other words, this additional chip select access time delay is only experienced when the SRAM 18 transitions from the deselect mode to the select mode.

The additional time delay introduced by the chip select OCR 22 is propagated throughout the remaining signal paths connected to the address OCR 24. As shown in FIG. 1, the output of the address OCR 24 is connected to an address decoder 28 via an address delay circuit 30, and to an address transition detect (ATD) circuit 32. Because of the unavoidable time delay in responding to the chip select pulse, a longer access time is required when the memory device 18 is coming out of the deselect mode to the select mode. An approach to avoid the extended access time has been to keep the address OCRs 24 on during the deselect mode and incur the resulting additional power loss.

SUMMARY OF THE INVENTION

In view of the foregoing background, it is therefore an object of the present invention to reduce the chip select access time for an SRAM device, as when transitioning the SRAM device from a deselect mode to a select mode.

It is another object of the invention to improve the chip select access time for an SRAM device without incurring an additional power loss.

It is yet another object of the invention to provide a method for reducing a chip select access time when transitioning an SRAM device from a deselect mode to a select mode.

These and other objects, features and advantages in accordance with the present invention are provided by a memory device having a plurality of address on-chip receivers (OCRs) for receiving an address signal, an address decoder connected to the address OCRs, and a plurality of first delay circuits, each of which is respectively coupled between the address OCRs and the address decoder, and a plurality of chip select bypass circuits. Each chip select bypass circuit is respectively coupled to one of the plurality of first delay circuits for initially reducing a delay therein responsive to a control signal.

Each chip select bypass circuit includes a second delay circuit having a delay less than the first delay circuit, and a disable circuit. The disable circuit disables the first delay circuit and selectively couples the second delay circuit in place of the first delay circuit responsive to the control signal. The control signal is generated by a chip select OCR responsive to a chip select pulse.

The first delay circuit includes a plurality of inverter delay stages, and the second delay circuit includes at least one inverter delay stage. Each delay stage includes a pair of series connected n channel metal oxide semiconductor (NMOS) transistors coupled to a first voltage reference, and a pair of series connected p channel metal oxide semiconductor (PMOS) transistors coupled to a second voltage reference. The NMOS and PMOS transistors are coupled together in series. The chip select bypass circuit disables at least one of the plurality of inverter delay stages in the first delay circuit responsive to the control signal.

Since the time delays provided by the first delay circuits are for synchronizing control lines, data lines and selected address lines with the bit line precharge circuits, they are not necessary during a chip select access. Therefore, to speed-up the chip select access time for placing the memory device from a deselect mode to a select mode, the first delay circuits are bypassed via the second delay circuits having a shorter delay path.

Advantageously, the time delay between the address access (normal mode) and a chip select access (select mode) are balanced so that the propagation of the address signal is nearly identical with propagation of other corresponding signals within the memory device. In other words, the time delay introduced by transitioning the memory device from a deselect mode to a select mode is set equal to the time delay of initially receiving the address signal and propagating this signal through the memory device.

The shorter delay path provided by the chip select bypass circuit improves the chip select access time without incurring any additional power consumption, e.g., such as leaving the address OCRs in an enabled mode when the remainder of the memory device is in a deselect mode. When the memory device is included in an electronic device that operates from a battery powered source or is included in an electronic device which has limited ability to generate power, such as a satellite, for example, operation of the electronic device is prolonged when power is conserved. The memory device is a static random access memory (SRAM), which may operate asynchronously or synchronously.

Another aspect of the invention relates to a method for accessing a memory device including a plurality of address on-chip receivers (OCRs) for receiving an address signal; an address decoder connected to the address OCRs; and respective delay circuits connected between the address OCRs and the address decoder. The method includes the step of initially reducing a delay of the delay circuits responsive to a control signal. The method also includes the step of generating the control signal responsive to a chip select pulse.

Each delay circuit includes a first group of delay stages and a second group of delay stages, wherein the second group of delay stages has a delay less than the first group of delay stages. The step of initially reducing the delay of the delay circuits includes selectively coupling the second group of delay stages in place of the first group of delay stages.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
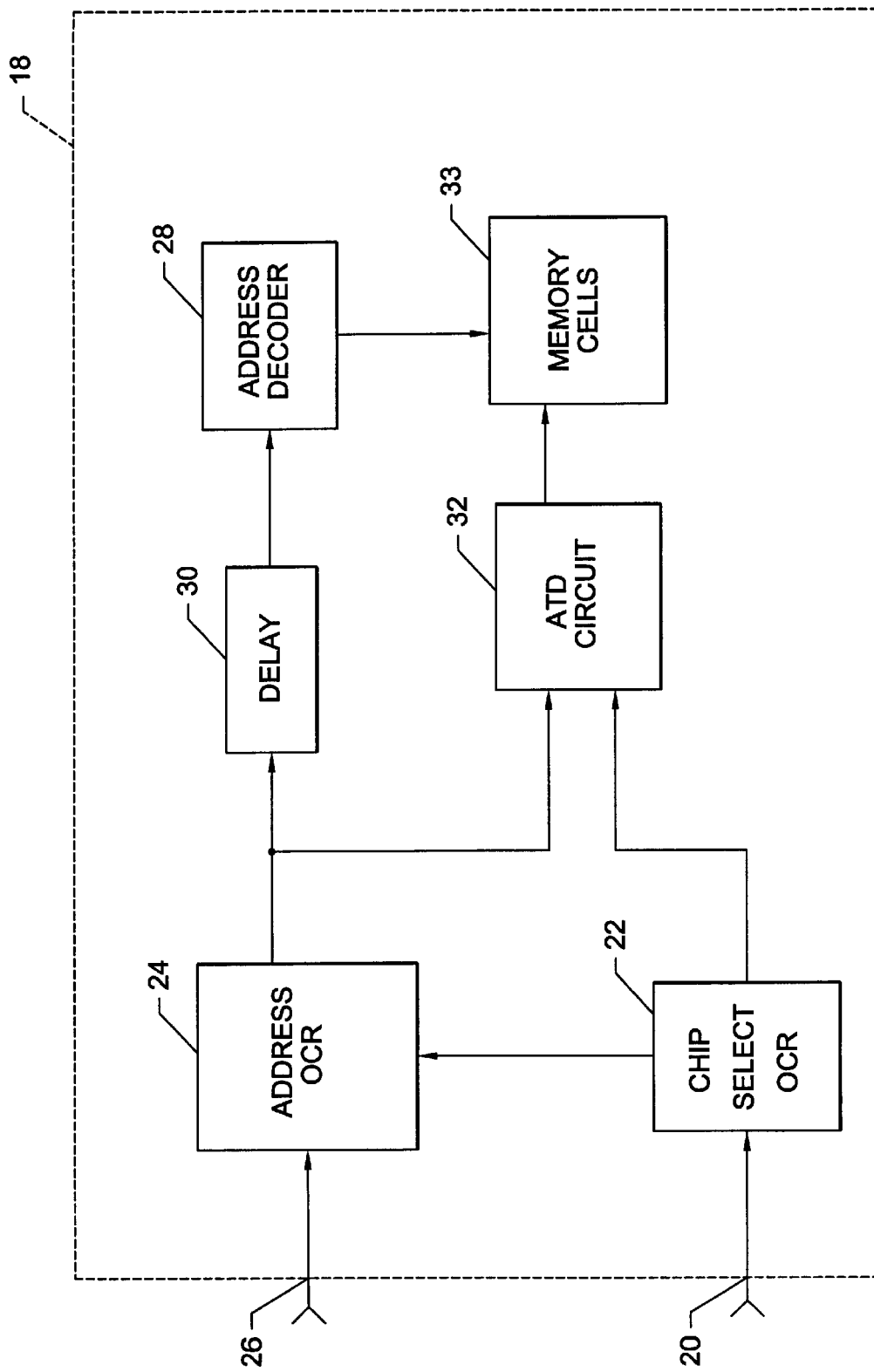
FIG. 1 is an interface diagram for a chip select circuit in an SRAM device, according to the prior art.
Figure 2:
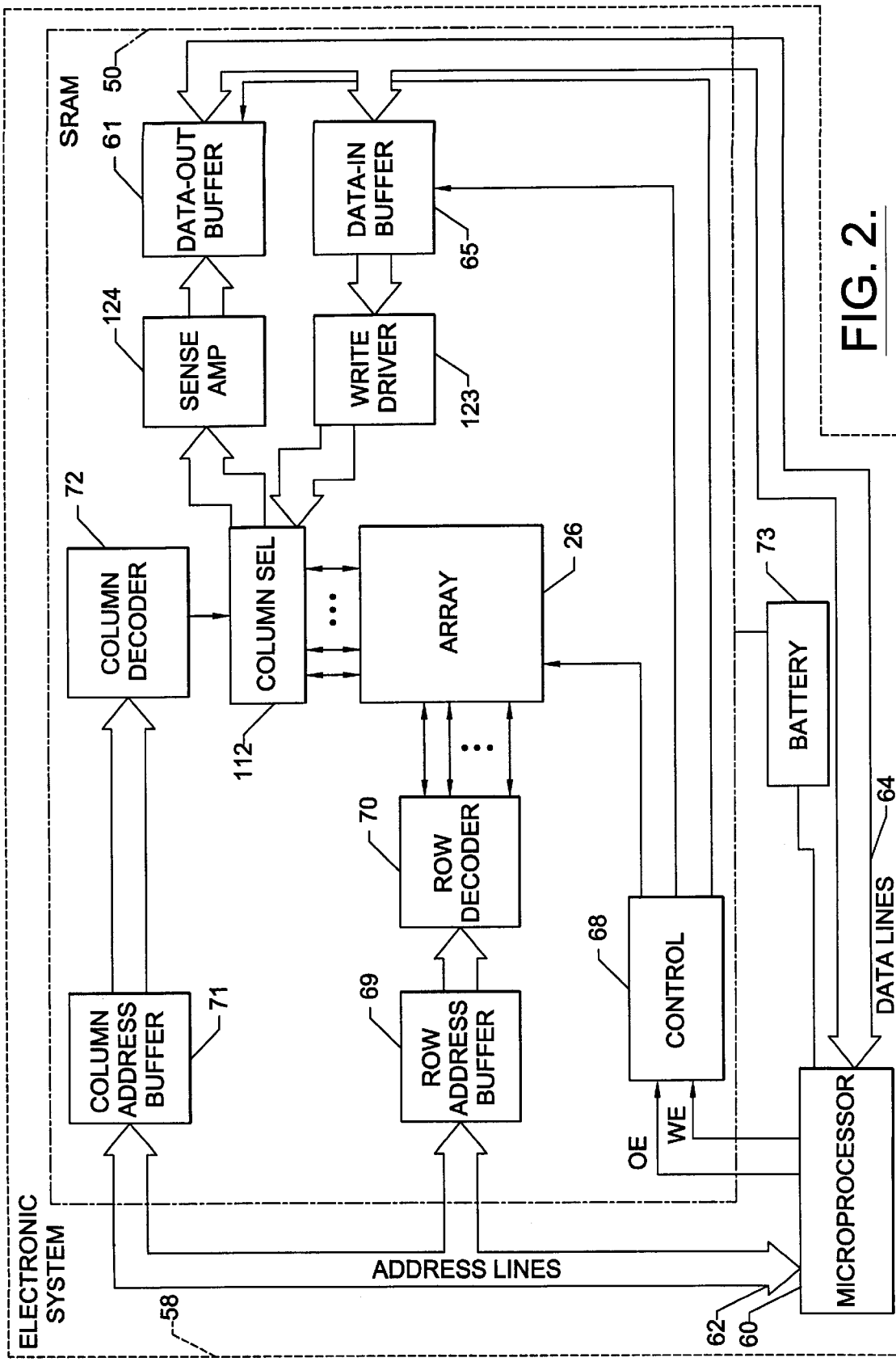
FIG. 2 is a block diagram of one embodiment of an SRAM device coupled to an electronic system, according to the present invention.

A static random access memory (SRAM) 50 having a select and deselect mode interfaces with, for example, an electronic system 58, as illustrated in FIG. 2. More particularly, the electronic system 58 includes a microprocessor 60 that interfaces with the SRAM 50 to provide and/or receive control, address and data information over a memory bus represented by individual inputs to the SRAM 50. These individual inputs are illustrated by data lines 64, address lines 62 and various discrete lines from the control logic circuit 68. Alternatively, the SRAM 50 may interface with an SRAM controller, a microcontroller, a chip set or other electronic system. The electronic system 58 may be powered by a battery 73.

The microprocessor 60 provides a number of control signals to the SRAM 50, including, but not limited to, row and column address signals, a write enable signal WE, an output enable signal OE and other conventional control signals as will be understood by those skilled in the art. Positive or negative logic may be used for the SRAM control signals. A control logic circuit 68 controls the many available functions of the SRAM 50, such as controlling data provided to the data-in buffers 61 by the microprocessor 60 and data provided to the microprocessor by the data-out buffers 65. In addition, various control circuits and signals not detailed herein initiate and synchronize the SRAM 50 operations as also known to those skilled in the art.

A row address buffer 69 and a row decoder 70 receive and decode row addresses from row address signals placed on the address lines 62 by the microprocessor 60. Each unique row address corresponds to a row of cells in the memory array 26. The row decoder 70 includes a word line driver, an address decoder tree, and circuitry which translates a given row address received from the row address buffers 69 and selectively activates the appropriate word line of the memory array 26 via the word line drivers. A column address buffer 71 and a column decoder 72 receive and decode column address signals provided on the address lines 62. The column decoder is coupled to the column selector 112, and to complementary bit line pairs of the memory array 26. The column selector 112 is also coupled to sense amplifiers 124 and write drivers 123, as will be readily understood by one skilled in the art. The sense amplifiers 124 are coupled to the data lines via the data-out buffers 61. Similarly, the write drivers 123 are coupled to the data lines via the data-in buffers 65.

During a write operation, the data lines 64 provide data to the data-in buffers 61 from the microprocessor 60. Write drivers 123 receive data from the data-in buffers 61 and write the data in the memory array 26 at an address specified on the address lines 62. During a read operation, a sense amplifier of the sense amplifiers 124 detects and amplifies a difference in voltage between the complementary bit line pair. Address information received on the address lines 62 selects a subset of the bit lines and couples them to the complementary pairs of input/output (I/O) wires or lines.

Figure 3:
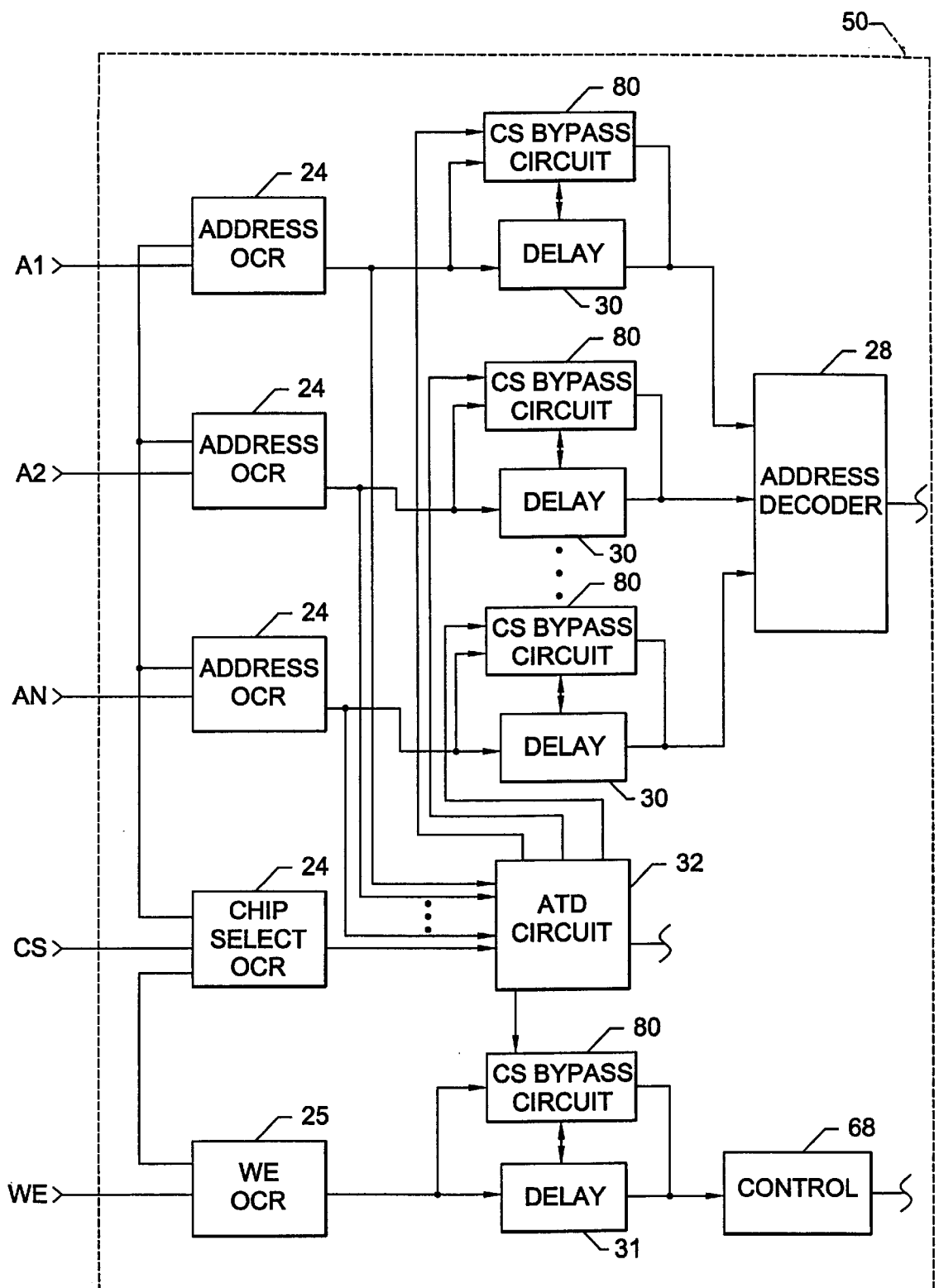
FIG. 3 is a detailed block diagram of one embodiment of a chip select bypass circuit in an SRAM device, according to the present invention.

To speed-up the chip select access time for placing the SRAM 50 in a select mode from a deselect mode, a chip select bypass circuit 80 is provided for each first delay circuit 30 connected between the respective address OCRs 24 and the address decoder 28, as shown in FIG. 3. The chip select bypass circuit 80 is also applicable to the write enable (WE) signal. A chip select bypass circuit 80 is provided for the WE first delay circuit 31 connected between a WE OCR 25 and the control logic circuit 68. In the normal address mode, the first delay circuits 30, 31 synchronize the address input signal and the WE signal received at the respective OCRs with the bit line precharge signals initiated by the ATD circuit 32.

Prior to the normal address mode, i.e., transition from a deselect mode to a select mode, the chip select bypass circuit 80 balances or equalizes the time delay between an address access (normal mode) and a chip select access (select mode) so that propagation of the address and WE signals are nearly identical with propagation of other corresponding signals within the SRAM 50. In other words, the time delay introduced in transitioning the SRAM 50 from a deselect mode to a select mode chip select is set equal, by the chip select bypass circuit 80, to the time delay of initially receiving the address and WE signals and propagating these signals through the memory device.

For purposes of illustrating the present invention, only the chip select bypass circuit 80 coupled to the first delay circuit 30 connected between an address OCR 24 and the address decoder 28 is described. Connection of the chip select bypass circuit 80 to the first delay circuit 31 connected between a WE OCR 25 and the control circuit logic 68 is similar, as will be readily understood by one skilled in the art. Accordingly, this interface will not be discussed in any further detail. In addition, the chip select bypass circuit 80 is applicable to other delay paths within the SRAM 50 requiring a shorter delay during transition from the select mode to the normal mode.

Address transition is detected by the ATD circuits 32 for precharging the bit lines, as well as for other functions, such as generating the chip select blocking pulse for causing the address signal to be directed through the shorter delay path. Increased speed in the SRAM 50 is reflected by lower access times. During the unselected mode, the addresses internal to the SRAM 50 are at a logic high state. When an address OCR 24 receives an external address signal that is a low level logic state, the transition from the deselect mode will cause the address OCR 24 to provide an address transition which is detected as such when the address OCR is disabled during the deselect mode. There is then an unnecessary address transition pulse generated as a consequence of the address OCR 24 being disabled during the deselect mode. Therefore, the delays provided by the first delay circuits 30 for synchronizing the received address signal with the bit line precharge circuits are not necessary during a chip select access.

The first delay circuit 30 delays a signal through a first delay path. Because the delay is not required for a chip select access, as explained above, the chip select bypass circuit 80 for a respective first delay circuit 30 causes the address signal to bypass the first delay path. The access time through a second delay path in the chip select bypass circuit 80 is less than the access time through the first delay path. Consequently, the additional time delay introduced by the chip select OCR 22 and the time required for enabling the address OCRs 24 and the WE OCR 25 are offset by bypassing the respective first delay paths 30 and 31. The chip select bypass circuits 80 improves the chip select access time by approximately 3–5 ns for the SRAM 50.

Figure 4:
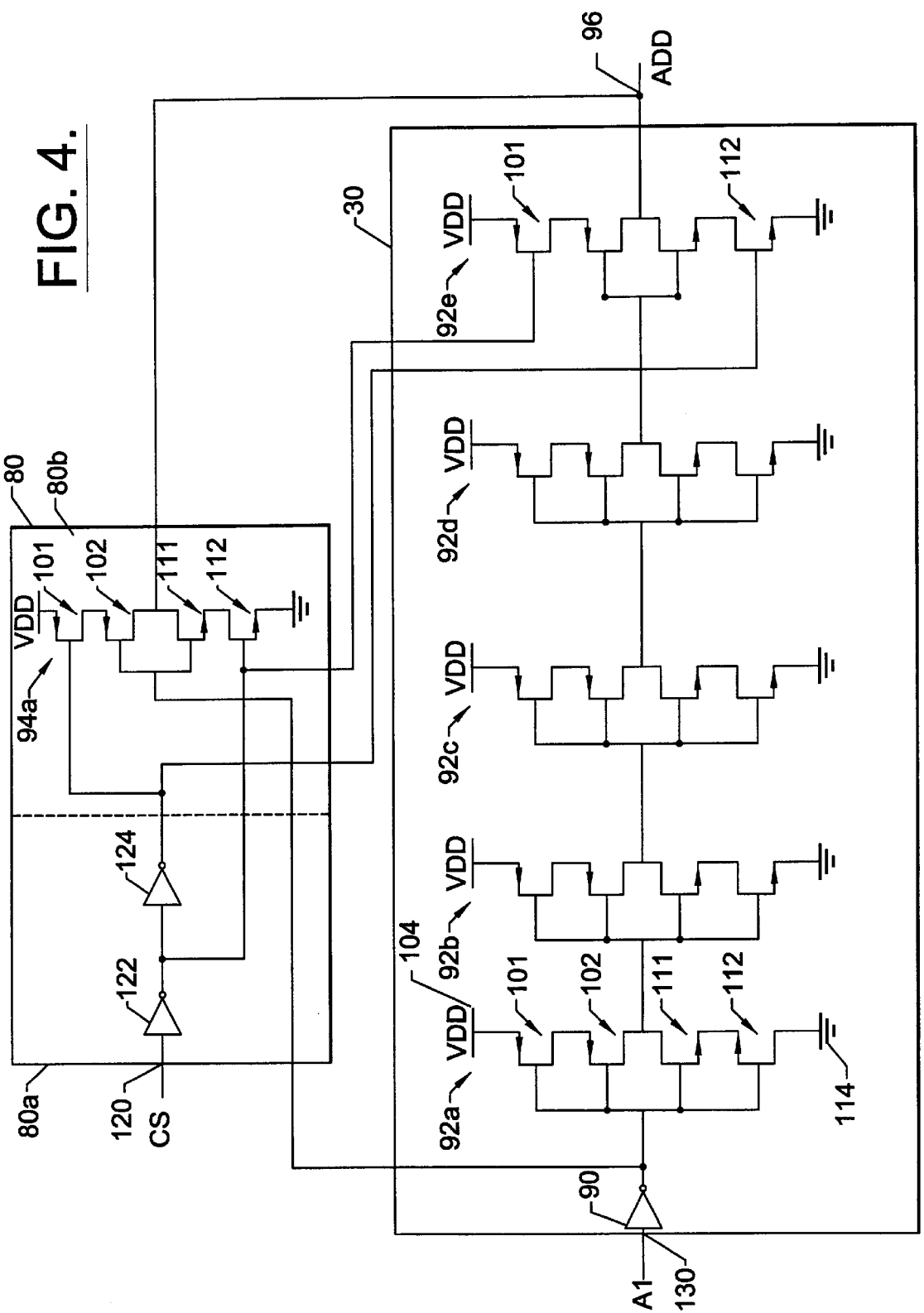
FIG. 4 is a schematic circuit diagram of one embodiment of the chip select bypass circuit and the first delay circuit, according to the present invention.

Referring now to FIG. 4, a schematic circuit diagram of one embodiment of the chip select bypass circuit 80 including the first delay circuit 30 will be described. In the normal address mode (select mode) of the SRAM 50, an address input signal, for example, an address signal applied to address input A1, is received by the corresponding address OCR 24 without any time delay caused by the chip select pulse. The chip select bypass circuit 80 is disabled in the normal address mode so that the address signal passes through the first delay circuit 30 to the address decoder 28.

The chip select bypass circuit 80 includes a disable circuit 80a and a second delay circuit 80b having a delay less than the first delay circuit 30. The disable circuit 80a includes a plurality of series connected inverters 122, 124 for disabling the first delay circuit 30 and selectively coupling the second delay circuit 80b in place of the first delay circuit. The disable circuit 80a is responsive to a control signal. This control signal may be generated external the SRAM 50.

The address signal received at input 130 of the first delay circuit 30 is first inverted by an inverter 90. The output of the inverter 90 is applied to the first inverter delay stage 92a within the first delay circuit 30, and to an inverter delay stage 94a in the second delay circuit 80b. The inverter delay stage 94a in the second delay circuit 80b is not enabled so that the address signal propagates through the second, third, fourth and fifth inverter delay stages 92b–92e to the output terminal 96 of the first delay circuit 30.

Each of the inverter delay stages 92a–92e in the first delay circuit 30 may be formed by a pair of series connected n channel metal oxide semiconductor (NMOS) transistors 101, 102 connected to a first voltage source 104, and connected in series to a pair of series connected p channel metal oxide semiconductor (PMOS) transistors 111, 112 connected to a second voltage source 114. The second voltage source 114 may be ground. Inverter delay stages are well known by one skilled in the art. Of course, other types of delay circuits are acceptable in lieu of the inverter delay stages 92a–92e described herein.

The chip select pulse is active low, and the chip select pulse must be active to read from or write to the memory array 26. If the chip select pulse is an inactive high, the SRAM 50 is placed in an inactive standby power mode. When the SRAM 50 transitions from the deselect mode to the select mode, the chip select bypass circuit 80 is selected so that the standard delay path in the first delay circuit 30 is bypassed. Selection of the second delay path 80b through the chip select bypass circuit 80 is by a chip select block pulse provided by the ATD circuit 32. The chip select block pulse is generated in response to receiving the chip select pulse from the chip select OCR 24. Once the chip select pulse transitions to the active low state, the chip select bypass circuit 80 becomes disabled so that the address signal propagates through the standard first delay path in the first delay circuit 30.

More specifically, the address delay circuit 30 is bypassed when the chip select block pulse applied to input 120 is a high logic level. The high level chip select pulse is inverted by a first inverter 122, the output of which is then inverted back to a high level signal by a second inverter 124. The first and second inverters 122, 124 form the disable circuit 80a. The low level output signal of the first inverter 122 is applied to the n channel MOS transistor 101 in the fifth inverter delay stage 92e in the first delay circuit 30. This n channel MOS transistor 101 is turned off by the low level chip select pulse.

Similarly, the p channel MOS transistor 112 in the fifth inverter delay stage 92e receives the high level chip select pulse from the output of the second inverter 124 from the disable circuit 80a. With the fifth inverter delay stage 92e turned off, the address signal applied to input 130 of the first delay circuit 30 is routed to the single inverter delay stage 94a in the second delay circuit 80b.

In the illustrated embodiment, the inverter delay stage 94a is also formed by a pair of series connected n channel MOS transistors 101, 102 connected to a first voltage source 104, and connected in series to a pair of series connected p channel MOS transistors 111, 112 connected to a second voltage source 114. The second voltage source 114 may also be ground.

The high level chip select pulse provided by the output of the second inverter 124 also turns on the n channel MOS transistor 101 of the inverter delay stage 94a in the second delay circuit 80b. Similarly, the low level chip select pulse provided by the output of the first inverter 122 turns on the p channel MOS transistor 112 in the same inverter delay stage 94a. With the n channel and p channel MOS transistors 101, 112 turned on, the single inverter delay stage 94a inverts the address signal and provides the inverted address signal to the output terminal 96 of the first delay circuit 30.

Since the first delay circuits 30 are not needed when the SRAM 50 is placed in a select mode from a deselect mode, the chip select bypass circuit 80 improves the chip select access time. The chip select access time is improved because the address signals are routed through only one inverter delay stage 94a instead of through five inverter delay stages 92a–92e.

Another aspect of the invention relates to a method for accessing a memory device including a plurality of address on-chip receivers (OCRs) 24 for receiving an address signal; an address decoder 28 connected to the address OCRs; and respective delay circuits 30 connected between the address OCRs and the address decoder. The method includes the step of initially reducing a delay of the delay circuits 30 responsive to a control signal. The method also includes the step of generating the control signal responsive to a chip select pulse.

Each delay circuit includes a first group of delay stages 30 and a second group of delay stages 80, wherein the second group of delay stages has a delay less than the first group of delay stages. The step of initially reducing the delay of the delay circuits includes selectively coupling the second group of delay stages 80 in place of the first group of delay stages 30.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

What is claimed is:

1. A memory device comprising:
   a plurality of address on-chip receivers (OCRs);
   an address decoder coupled to said address OCRs;
   a plurality of first delay circuits, each of which is respectively coupled between said address OCRs and said address decoder; and
   a plurality of chip select bypass circuits, each of which is respectively coupled to one of said plurality of first delay circuits for initially reducing a delay therein responsive to a control signal.

2. A memory device according to claim 1, wherein each chip select bypass circuit comprises:
   a second delay circuit having a delay less than said first delay circuit; and
   a disable circuit, wherein said disable circuit disables said first delay circuit and selectively couples said second delay circuit in place of said first delay circuit.

3. A memory device according to claim 2, wherein said second delay circuit comprises at least one inverter delay stage.

4. A memory device according to claim 3, wherein said at least one inverter delay stage comprises:
   a pair of series connected n channel metal oxide semiconductor (NMOS) transistors coupled to a first voltage reference; and
   a pair of series connected p channel metal oxide semiconductor (PMOS) transistors coupled to a second voltage reference, said pair of NMOS and PMOS transistors are coupled together in series.

5. A memory device according to claim 2, wherein said disable circuit comprises a plurality of series connected inverters.

6. A memory device according to claim 1, further comprising a chip select OCR for generating the control signal responsive to a chip select pulse.

7. A memory device according to claim 1, wherein each one of said first delay circuits comprises a plurality of inverter delay stages.

8. A memory device according to claim 7, wherein at least one of said plurality of inverter delay stages comprises:
   a pair of series connected n channel metal oxide semiconductor (NMOS) transistors coupled to a first voltage reference; and
   a pair of series connected p channel metal oxide semiconductor (PMOS) transistors coupled to a second voltage reference, said pair of NMOS and PMOS transistors are coupled together in series.

9. A memory device according to claim 1, wherein each one of said first delay circuits comprises a plurality of inverter delay stages; and wherein said chip select bypass circuit disables at least one of said plurality of inverter delay stages responsive to the control signal.

10. A memory device according to claim 1, further comprising a plurality of memory cells coupled to said address decoder.

11. A memory device according to claim 10, wherein each of said memory cells comprises a static random access memory cell.

12. A memory device comprising:
    a plurality of memory cells;
    a plurality of address on-chip receivers (OCRs);
    an address decoder coupled to said address OCRs and said memory cells;
    a chip select OCR;
    a plurality of first delay circuits, each of which is respectively coupled between said address OCRs and said address decoder;
    a plurality of second delay circuits having a delay less than said plurality of first delay circuits, each second delay circuit is respectively coupled to one of said plurality of first delay circuits; and
    a plurality of disable circuits, each of which is respectively coupled to one of said plurality of first and second delay circuits coupled together for initially reducing a delay of said first delay circuit responsive to a control signal generated by said chip select OCR.

13. A memory device according to claim 12, wherein each one of said second delay circuits comprises at least one inverter delay stage.

14. A memory device according to claim 13, wherein said at least one inverter delay stage comprises:
    a pair of series connected n channel metal oxide semiconductor (NMOS) transistors coupled to a first voltage reference; and
    a pair of series connected p channel metal oxide semiconductor (PMOS) transistors coupled to a second voltage reference, said pair of NMOS and PMOS transistors are coupled together in series.

15. A memory device according to claim 12, wherein said disable circuit comprises a plurality of series connected inverters.

16. A memory device according to claim 12, wherein each one of said first delay circuits comprises a plurality of inverter delay stages; and wherein said respective disable circuit disables at least one of said plurality of inverter delay stages responsive to the control signal.

17. A memory device according to claim 12, wherein each one of said first delay circuits comprises a plurality of inverter delay stages.

18. A memory device according to claim 17, wherein at least one of said plurality of inverter delay stages comprises:
a pair of series connected n channel metal oxide semiconductor (NMOS) transistors coupled to a first voltage reference; and
a pair of series connected p channel metal oxide semiconductor (PMOS) transistors coupled to a second voltage reference, said pair of NMOS and PMOS transistors are coupled together in series.

19. A memory device according to claim 12, further comprising a plurality of memory cells coupled to said address decoder.

20. A memory device according to claim 19, wherein each of said memory cells comprises a static random access memory cell.

21. A chip select bypass circuit comprising:
a first group of delay stages coupled between an on-chip receiver (OCR) and a functional circuit;
a second group of delay stages coupled to said first group of delay stages, said second group of delay stages having a delay less than said first group of delay stages; and
a disable circuit coupled to said first and second group of delay stages to selectively couple said second group of delay stages in place of said first group of delay stages responsive to a control signal.

22. A chip select bypass circuit according to claim 21, wherein said disable circuit comprises a plurality of series connected inverters.

23. A chip select bypass circuit according to claim 21, further comprising a chip select OCR for generating the control signal responsive to a chip select pulse.

24. A chip select bypass circuit according to claim 21, further comprising an address transition detect (ATD) circuit coupled to said chip select OCR.

25. A chip select bypass circuit according to claim 21, wherein said OCR comprises an address OCR.

26. A chip select bypass circuit according to claim 21, wherein said OCR comprises a write enable OCR.

27. A chip select bypass circuit according to claim 21, wherein said functional circuit comprises an address decoder.

28. A chip select bypass circuit according to claim 27, wherein said decoder is coupled to a plurality of memory cells.

29. A chip select bypass circuit according to claim 28, wherein each of said memory cells comprises a static random access memory cell.

30. A chip select bypass circuit according to claim 21, wherein said first group of delay stages comprises a plurality of inverter delay stages.

31. A chip select bypass circuit according to claim 30, wherein at least one of said first group of delay stages comprises:
a pair of series connected n channel metal oxide semiconductor (NMOS) transistors coupled to a first voltage reference; and
a pair of series connected p channel metal oxide semiconductor (PMOS) transistors coupled to a second voltage reference, said pair of NMOS and PMOS transistors are coupled together in series.

32. A chip select bypass circuit according to claim 21, wherein said second group of delay stages comprises at least one inverter delay stages, and wherein said at least one inverter delay stage comprises:
a pair of series connected n channel metal oxide semiconductor (NMOS) transistors coupled to a first voltage reference; and
a pair of series connected p channel metal oxide semiconductor (PMOS) transistors coupled to a second voltage reference, said pair of NMOS and PMOS transistors are coupled together in series.

33. An electronic system comprising:
a microprocessor; and
a memory device coupled to said microprocessor, said memory device comprising
addressing circuitry coupled to said microprocessor, said addressing circuitry comprising a plurality of address on-chip receivers (OCRs),
an address decoder coupled to said address OCRs,
an input/output data buffer coupled to said microprocessor,
an array of word lines and bit line pairs coupled to said address decoder and to said input/output data buffer,
a plurality of memory cells arranged in row and columns and coupled to said array of word lines and bit lines,
a plurality of first delay circuits, each of which is respectively coupled between said address OCRs and said address decoder, and
a plurality of chip select bypass circuits, each of which is respectively coupled to one of said plurality of first delay circuits for initially reducing a delay therein responsive to a control signal.

34. An electronic system according to claim 33, wherein each chip select bypass circuit comprises:
a second delay circuit having a delay less than said first delay circuit; and
a disable circuit, wherein said disable circuit disables said first delay circuit and selectively couples said second delay circuit in place of said first delay circuit.

35. An electronic system according to claim 34, wherein said second delay circuit comprises at least one inverter delay stage.

36. An electronic system according to claim 35, wherein said at least one inverter delay stage comprises:
a pair of series connected n channel metal oxide semiconductor (NMOS) transistors coupled to a first voltage reference; and
a pair of series connected p channel metal oxide semiconductor (PMOS) transistors coupled to a second voltage reference, said pair of NMOS and PMOS transistors are coupled together in series.

37. An electronic system according to claim 34, wherein said disable circuit comprises a plurality of series connected inverters.

38. An electronic system according to claim 33, further comprising a chip select OCR for generating the control signal responsive to a chip select pulse.

39. An electronic system according to claim 33, wherein each one of said first delay circuits comprises a plurality of inverter delay stages.

40. An electronic system according to claim 39, wherein at least one of said plurality of inverter delay stages comprises:
a pair of series connected n channel metal oxide semiconductor (NMOS) transistors coupled to a first voltage reference; and a pair of series connected p channel metal oxide semiconductor (PMOS) transistors coupled to a second voltage reference, said pair of NMOS and PMOS transistors are coupled together in series.

41. An electronic system according to claim 33, wherein each one of said first delay circuits comprises a plurality of inverter delay stages; and wherein said chip select bypass circuit disables at least one of said plurality of inverter delay stages responsive to the control signal.

42. An electronic system according to claim 33, further comprising a plurality of memory cells coupled to said address decoder.

43. An electronic system according to claim 42, wherein each of said memory cells comprises a static random access memory cell.

44. A method for accessing a memory device comprising a plurality of address on-chip receivers (OCRs) for receiving address signals; an address decoder coupled to said address OCRs; respective delay circuits coupled between said address OCRs and said address decoder; the method comprising:

providing at least one address signal from one of the plurality address OCRs to the address decoder via a respective delay circuit; and initially reducing a delay of the respective delay circuit responsive to a control signal.

45. A method according to claim 44, wherein each delay circuit comprises a first group of delay stages and a second group of delay stages, the second group of delay stages has a delay less than the first group of delay stages; and the method further comprises:

selectively coupling the second group of delay stages in place of the first group of delay stages.

46. A method according to claim 44, further comprising generating the control signal responsive to a chip select pulse.

47. A method according to claim 44, wherein each delay circuit comprises a plurality of inverter delay stages; and the method further comprises disabling at least one of the plurality of inverter delay stages.

48. A method according to claim 44, wherein the memory device is a Static Random Access Memory.

* * * * *